United States Patent [19]
Lan et al.

[11] Patent Number: 6,111,435
[45] Date of Patent: Aug. 29, 2000

[54] LOW POWER MULTIPLEXER WITH SHARED, CLOCKED TRANSISTOR

[75] Inventors: Jiann-Cherng James Lan, San Jose; Mahadevamurty Nemani, Sunnyvale; Narsing K. Vijayrao, Santa Clara; Wenjie Jiang, Sunnyvale; Sudarshan Kumar, Fremont, all of Calif.

[73] Assignee: Intel Corporation, Santa Clara, Calif.

[21] Appl. No.: 09/343,961

[22] Filed: Jun. 30, 1999

[51] Int. Cl.[7] .................................................. H03K 19/20
[52] U.S. Cl. ........................... 326/121; 121/105; 121/106
[58] Field of Search ..................................... 326/121, 113, 326/114, 52, 55, 104, 105, 106

[56] References Cited

U.S. PATENT DOCUMENTS

| | | |
|---|---|---|
| 5,592,107 | 1/1997 | McDermott et al. ................... 326/121 |
| 5,889,416 | 3/1999 | Lovett .................................... 326/121 |
| 5,986,480 | 11/1999 | Sharpe-Geisler ...................... 326/121 |

*Primary Examiner*—Tan T. Nguyen
*Attorney, Agent, or Firm*—David J. Kaplan

[57] ABSTRACT

A circuit includes first and second pull-up transistors having first and second drains, respectively, each coupled to separate voltage clamps. The gates of each of the two pull-up transistors are coupled to a clock signal line. The circuit further includes a shared pull-down transistor, the gate of which is coupled to the clock signal line. The drain of the shared pull-down transistor is coupled to the first drain via at least one pull-down transistor in series with the shared pull-down transistor. The drain of the shared pull-down transistor is also coupled to the second drain via at least one pull-down transistor in series with the shared pull-down transistor. This circuit may be found useful in multiplexing applications.

18 Claims, 6 Drawing Sheets

LOW POWER MULTIPLEXER WITH SHARED, CLOCKED TRANSISTOR

The present invention relates to integrated circuits and more particularly to a clocked multiplexer that shares the same, clock-gated pull-down transistor for reduced power consumption in a processor.

BACKGROUND

Computer systems, from small handheld electronic devices to medium-sized mobile and desktop systems to large servers and workstations, are becoming increasingly pervasive in our society. Computer systems typically include one or more processors. A processor manipulates and controls the flow of data in a computer by executing instructions. Decreasing the size of the processor and reducing its power consumption lowers the cost and improves the reliability of the processor. Processor designers employ many different techniques to decrease processor size and to reduce power consumption to create less expensive and more robust computers for consumers.

Typically, for a given frequency and transistor size, circuits having more transistors that are actively switched tend to consume more power than circuits having fewer transistors that are actively switched. Therefore, designers strive to reduce the number of actively switched transistors, such as those that are gated (or clocked) by a high frequency clock signal. These transistors include, for example, clock buffer transistors having gates coupled to a clock signal line.

Unfortunately, to increase processor performance, the total transistor count of the processor typically must increase. Thus, there is a constant struggle between the need for processor designers to increase the performance of a processor and the need to reduce the number of clocked transistors in the processor to reduce power consumption. The present invention addresses this struggle.

SUMMARY OF THE INVENTION

A circuit includes first and second pull-up transistors having first and second drains, respectively, each coupled to separate voltage clamps. The gates of each of the two pull-up transistors are coupled to a clock signal line. The circuit further includes a shared pull-down transistor, the gate of which is coupled to the clock signal line. The drain of the shared pull-down transistor is coupled to the first drain via at least one pull-down transistor in series with the shared pull-down transistor. The drain of the shared pull-down transistor is also coupled to the second drain via at least one pull-down transistor in series with the shared pull-down transistor.

BRIEF DESCRIPTION OF THE DRAWINGS

The present invention is illustrated by way of example and not limitation in the accompanying figures in which like references indicate similar elements and in which.

DETAILED DESCRIPTION

In accordance with an embodiment of the present invention, the power consumption and size of a multiplexer is reduced by sharing a single, clocked, pull-down transistor. In other words, each NAND gate of the multiplexer includes the same, clocked, pull-down transistor. Such a circuit may be used to replace any multiplexer that receives mutually exclusive select signals. Because the select signals are mutually exclusive, the shared pull-down transistor need not be excessively large because only one NAND gate of the multiplexer is pulled down at any given time. As a result, there is a significant power savings over a multiplexer having a separate, clocked, pull-down transistor dedicated to each NAND gate or group of NAND gates.

A more detailed description of embodiments of the present invention, including various configurations and implementations, is provided below.

As used herein, the term "mutually exclusive" means that under normal operating conditions, only one signal at a time is active when the clock signal is active, wherein "active" refers to a logic level state that is defined as "high" or "low" for a particular signal. The terms "source" and "drain", as used herein, may be used interchangeably to identify either the source or drain of a p or n-channel transistor. A "pull-up" transistor is a transistor that, when activated (i.e. turned on), has a tendency to raise the voltage level at its drain, "pulling" it (or driving it) up to the approximate voltage level at its source (which is typically close to the power supply voltage level). This may also be referred to as charging a node. A "pull-down" transistor is a transistor that, when activated, has a tendency to lower the voltage level at its drain, "pulling" it (or driving it) down to the approximate voltage level at its source (which is typically close to ground). This may also be referred to as draining a node.

An "input node" is a physical, electrically conductive portion of a circuit that receives an electrical signal, as distinguished from an "input signal" which is the electrical signal itself. Typically, an input node is a transistor gate. An "output node" is a physical, electrically conductive portion of a circuit that sends (or drives) an electrical signal, as distinguished from an "output signal" which is the electrical signal itself. Typically, an output node is a transistor drain. An input signal is provided to an input node via an input signal line. An output signal is sent from an output node via an output signal line. A "voltage clamp" is a device that provides a feedback signal to its input node, and has a tendency to reinforce (or "clamp") the voltage at its input node.

Figure 1A:
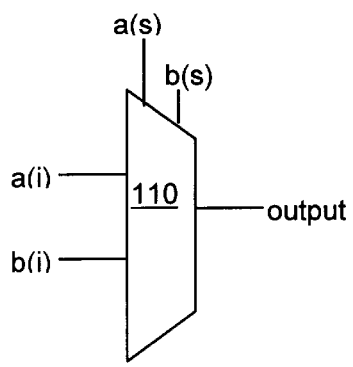
FIG. 1A is a dual input multiplexer.

FIG. 1A is a dual input multiplexer. Multiplexer 110 receives two input signals, a(i) and b(i), and two select signals, a(s) and b(s). Based on the values of select signals a(s) and b(s), multiplexer 110 passes the value of either input signal a(i) or b(i) through to its output node. For example, if a(s) is high, a(i) is provided as the output signal of multiplexer 100. If b(s) is high, b(i) is provided as the output signal.

Figure 1B:
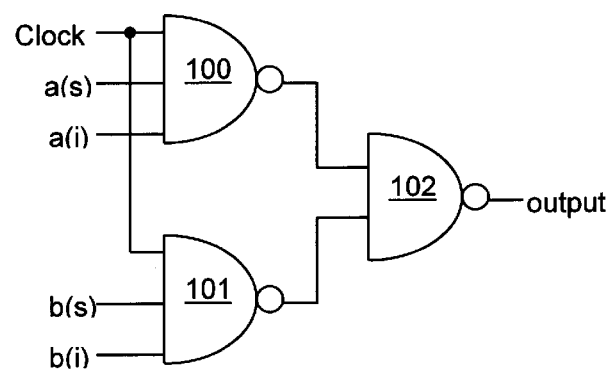
FIG. 1B is the multiplexer of FIG. 1A gated by a clock signal in logic diagram form.

FIG. 1B is a dual input multiplexer gated by a clock signal in logic diagram form. A clock signal is transmitted to the upper input node to each of NAND gates 100 and 101 via a clock signal line. A first select signal, a(s), is transmitted to the center input node of NAND gate 100 via a first input signal line, and a second select signal, b(s), is transmitted to the center input node of NAND gate 101 via a second input signal line. A first input signal, a(i), is transmitted to the lower input node of NAND gate 100 via a first select signal line, and a second input signal, b(i), is transmitted to the lower input node of NAND gate 101 via a second select signal line. The output signals of NAND gates 100 and 101 are provided to the input nodes of NAND gate 102, the output signal of which is the result of the multiplexing function described above in conjunction with FIG. 1A gated by the clock signal.

Figure 2:
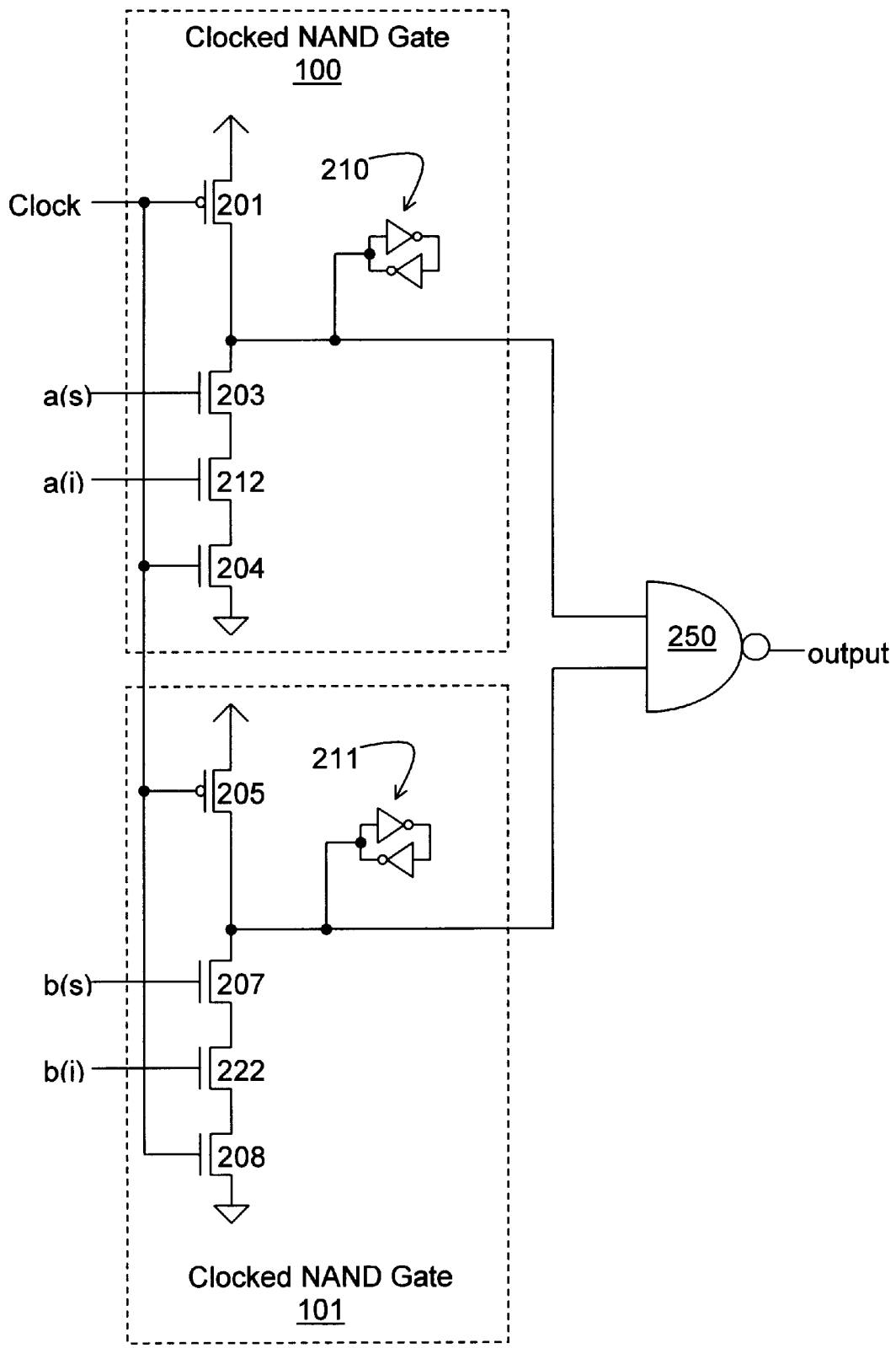
FIG. 2 is the multiplexer of FIG. 1B in circuit diagram form.

FIG. 2 is the multiplexer of FIG. 1B in circuit diagram form. Each of clocked NAND gates 100 and 101 is shown as separate circuit blocks in FIG. 2. NAND gate 100 includes pull-up transistor 201 and pull-down transistor 204, both coupled to the clock signal line for gating by the clock signal. NAND gate 100 further includes pull-down transistor 203 coupled to the first select signal line for gating by select signal a(s). NAND gate 100 also includes pull-down transistor 212 coupled to the first input signal line for gating by input signal a(i). NAND gate 101 includes pull-up transistor 205 and pull-down transistor 208, both coupled to the clock signal line for gating by the clock signal. NAND gate 101 further includes pull-down transistor 207 coupled to the second signal line for gating by select signal b(s). NAND gate 101 also includes pull-down transistor 222 coupled to the second input signal line for gating by input signal b(i). NAND gate 100 includes voltage clamp 210 coupled to the NAND gate output node, and NAND gate 101 includes voltage clamp 211 coupled to the NAND gate output node.

Note that clocked pull-down transistors 204 and 208 of FIG. 2 are toggled with each clock pulse. In a typical processor in which the frequency of the clock signal is high and the clock signal is applied to numerous pull-down transistors, this constant toggling of the pull-down transistors can amount to a substantial power drain. Reducing the number of pull-down transistors by, for example, combining transistors 204 and 208 into a single transistor might not substantially reduce this power drain. This is because the combined transistor would need to be twice the size (i.e. width) of the original transistors to maintain proper output signal timing. Hence, there would be little or no power savings because the combined, larger transistor would consume about as much power as the separate, smaller transistors.

The result may be different, however, if the relationship between signals a(i), a(s), b(i), and b(s) are taken into account. If, for example, a(s) and b(s) are mutually exclusive signals, then the combined pull-down transistor would not need to be twice the size of either transistor 204 or 208 of FIG. 2 because the combined pull-down transistor would not need to drain the output nodes of both NAND gates simultaneously. Instead, the combined transistor need be only slightly larger than either transistor 204 or 208 to overcome the additional source load from pull-down transistors 203, 212, 207, and 222. The result is the shared, clocked pull-down transistor 305 of FIG. 3A. Note that clocked pull-down transistors 204 and 208 of FIG. 2 are approximately equal in size to the other pull-down transistors 203, 212, 207, and 222.

Figure 3A:
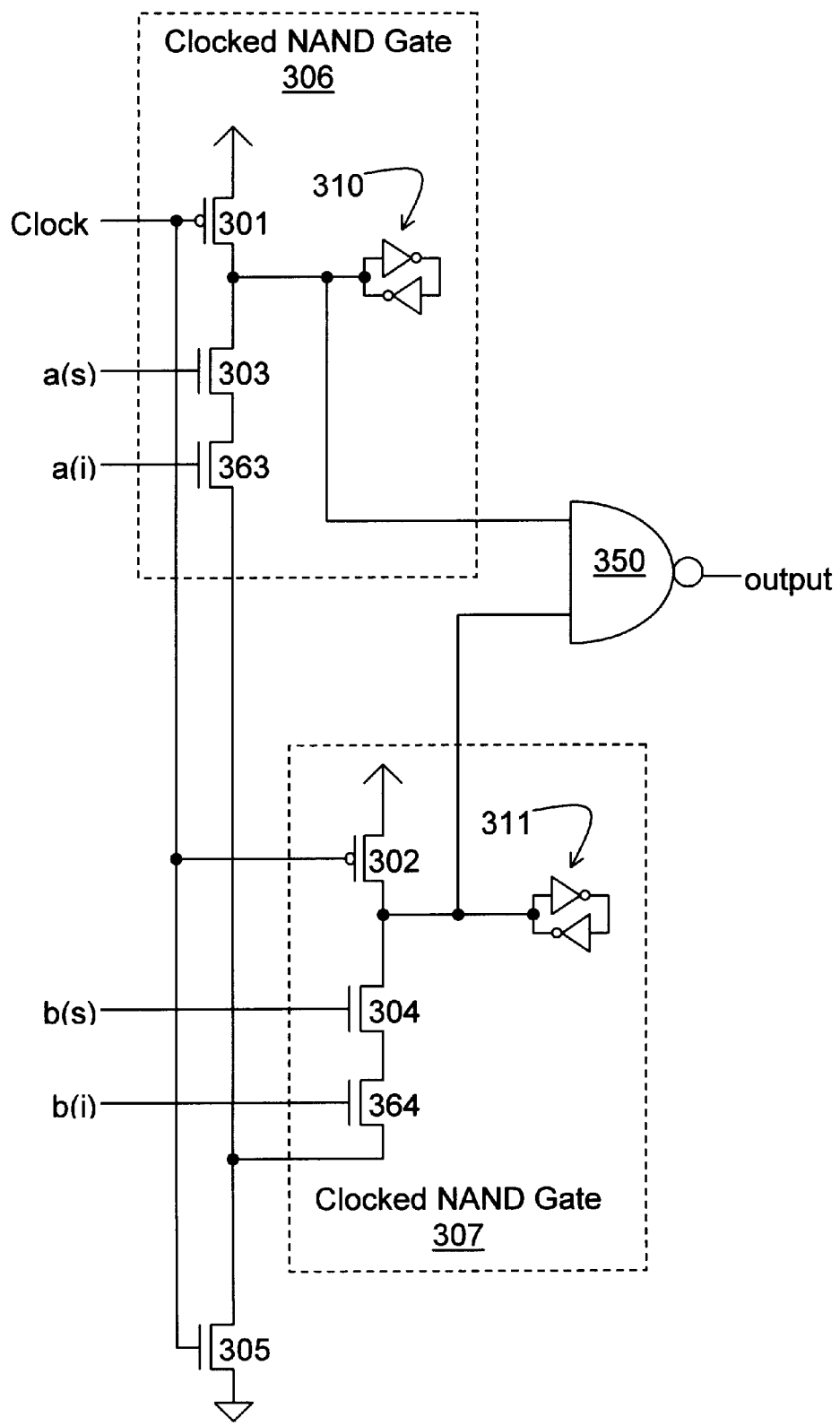
FIG. 3A is a dual input multiplexer gated by a clock signal in accordance with one embodiment of the present invention.

FIG. 3A is a dual input multiplexer gated by a clock signal in accordance with one embodiment of the present invention. The relationship between a(i), a(s), b(i), b(s), the clock signal, and the output signal is the same as described above with respect to FIGS. 1A, 1B, and 2. The clocked pull-down transistor 305, however, is now shared by both clocked NAND gates. Clocked NAND gate 306 includes clocked pull-up transistor 301 and clocked pull-down transistor 305 (shown outside NAND gate box 306 because it is shared with NAND gate 307). NAND gate 306 further includes pull-down transistors 303 and 363 gated by signals a(s) and a(i) transmitted along signal lines coupled to the gates of transistors 303 and 363, respectively. Clocked NAND gate 307 includes clocked pull-up transistor 302 and clocked pull-down transistor 305, as well as pull-down transistors 304 and 364 gated by signals b(s) and b(i) transmitted along signal lines coupled to the gates of transistors 304 and 364, respectively. The output signals of the two NAND gates are each coupled to an input node of NAND gate 350, the output signal of which is the multiplexed output signal of the circuit.

As shown in FIG. 3A, the output node of NAND gate 306 is coupled to the drain of clocked pull-up transistor 301 and to the drain of pull-down transistor 303. The source of transistor 303 is coupled to the drain of pull-down transistor 363, the source of which is coupled to the drain of shared, clocked, pull-down transistor 305. Similarly, the output node of NAND gate 307 is coupled to the drain of clocked pullup transistor 302 and to the drain of pull-down transistor 304. The source of transistor 304 is coupled to the drain of pull-down transistor 364, the source of which is coupled to the drain of shared, clocked, pull-down transistor 305. The sources of pull-up transistors 301 and 302 are coupled to a Vcc power supply line of the integrated circuit, and the source of shared pull-down transistor 305 is coupled to a ground line.

As described above, the size of pull-down transistor 305 is less than two times the size of either transistor 204 or 208 of FIG. 2. In other words, even though clocked pull-down transistor 305 drains (or drives low) the output nodes of both NAND gates 306 and 307, transistor 305 may be not much larger than the smaller of transistors 303, 304, 363, or 364, each of which drives only one or the other of the output nodes. Note, however, that transistor 305 may be slightly larger than the smaller of these transistors to overcome the source load of the transistors. For one embodiment of the present invention, transistor 305 is less than twice the size of the smaller of transistors 303, 304, 363, or 364. For another embodiment, transistor 305 is less than 1.5 times the size of the smaller of pull-down transistors 303, 304, 363, or 364, or less than 1.75 times the size of the smaller of pull-up transistors 301 or 302. The use of shared pull-down transistor 305 in each NAND gate of FIG. 3A serves to not only reduce the power consumed by the overall multiplexer but also reduce its size.

Each NAND gate of FIG. 3A includes a separate voltage clamp coupled to its output node. The first NAND gate includes voltage clamp 310 and the second NAND gate includes voltage clamp 311. These clamps prevent their respective output nodes from floating when the clock signal is high.

Figure 3B:
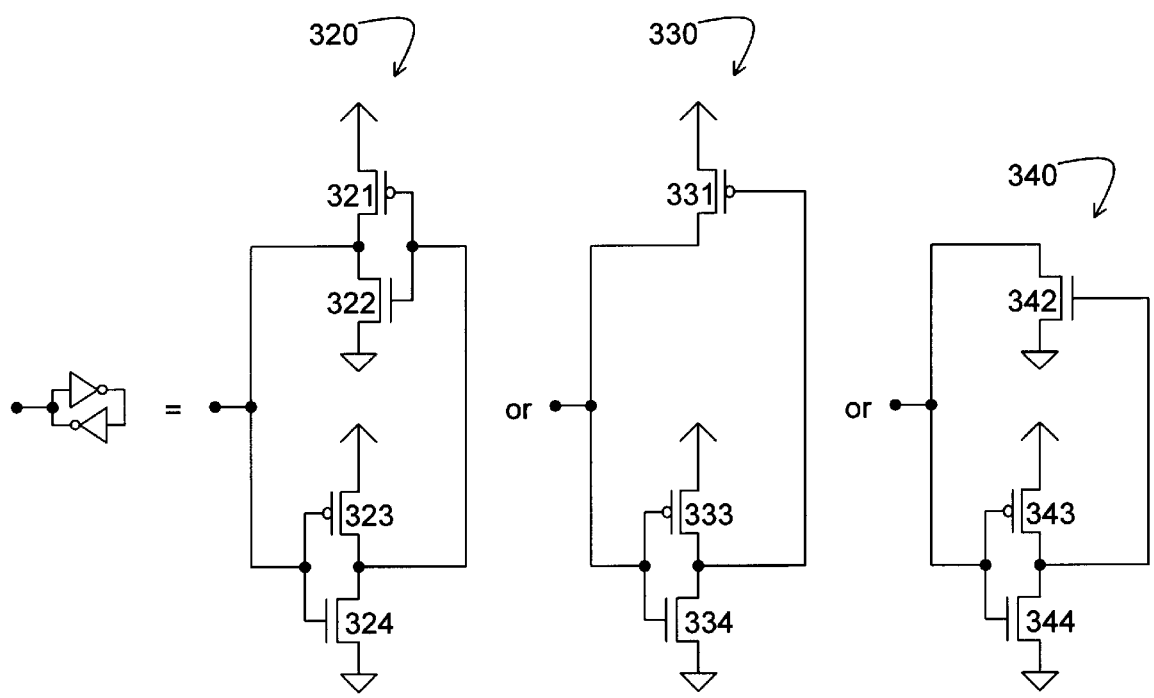
FIG. 3B shows alternate designs for the voltage clamp of FIG. 3A.

FIG. 3B provides three alternate designs for the voltage clamp of FIG. 3A (and for FIG. 4C described below). As shown, a voltage clamp is generally two inverters configured in a feedback loop. A voltage clamp typically provides a weak feedback voltage to the signal line being clamped such that the clamp can be easily overwhelmed by a moderately sized driving transistor (either pull-up or pull-down) on the signal line.

Voltage clamp 320 of FIG. 3B includes a full input inverter comprising transistors 323 and 324 and a full feedback inverter comprising transistors 321 and 322. Voltage clamp 320, therefore, provides both high and low signal clamping to a signal line. Voltage clamp 320 may also be found useful as voltage clamps 310 or 311 of FIG. 3A. Voltage clamp 330 includes a full input inverter comprising transistors 333 and 334 and a half feedback inverter comprising pull-up transistor 331. Voltage clamp 330, therefore, provides high signal clamping to a signal line. Voltage clamp 330 may also be found useful as voltage clamps 310 or 311 of FIG. 3A. Voltage clamp 340 includes a full input inverter comprising transistors 343 and 344 and a half feedback inverter comprising pull-down transistor 342. Voltage clamp 340, therefore, provides low (or ground) signal clamping to a signal line.

Figure 4A:
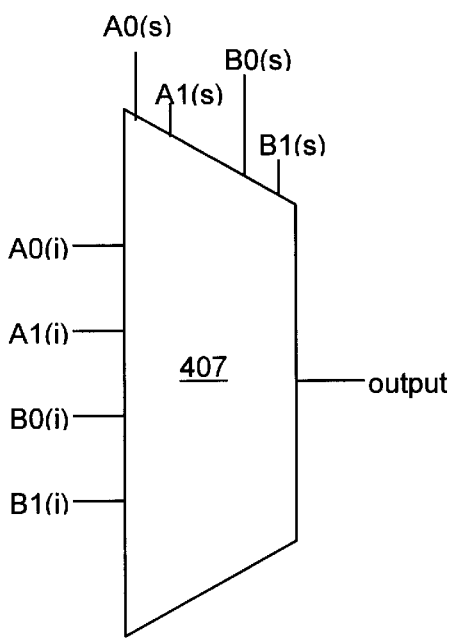
FIG. 4A is a four-input multiplexer.

FIG. 4A is a four-input multiplexer. Multiplexer 407 receives four input signals, A0(i), A1(i), B0(i), and B1(i), and four select signals, A0(s), A1(s), B0(s), and B1(s). Based on the values of the select signals, multiplexer 407 passes the value of the associated input signal through to its output node. For example, if A0(s) is high, A0(i) is provided at the output node of multiplexer 100. if A1(s) is high, A1(i) is provided at the output node. If B0(s) is high, B0(i) is provided at the output node, and if B1(s) is high, B1(i) is provided at the output node.

Figure 4B:
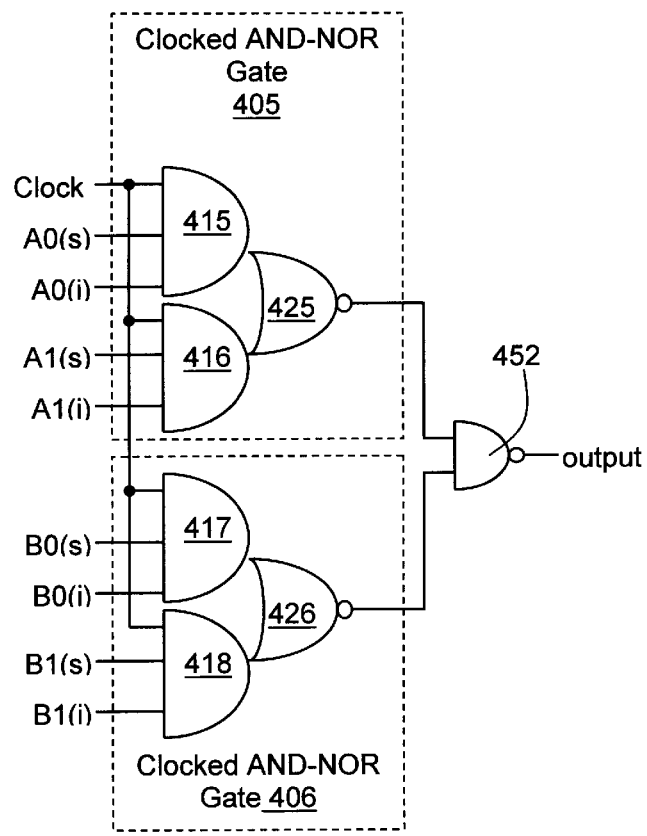
FIG. 4B the multiplexer of FIG. 4A gated by a clock signal in logic diagram form.

FIG. 4B is the multiplexer of FIG. 4A gated by a clock signal in logic diagram form. The multiplexer of FIG. 4B includes three logic gates, clocked AND-NOR gates 405 and 406 and NAND gate 452. A clock signal is transmitted to the input nodes of each of AND-NOR gates 405 and 406 via a clock signal line. Signals A0(i), A0(s), A1(i), and A1(s) are provided to clocked AND-NOR gate 405. Signals B0(i), B0(s), B1(i), and B1(s) are provided to clocked AND-NOR gate 406. The output signals of the AND-NOR gates are provided to the input nodes of NAND gate 452, the output signal of which is the result of the multiplexing function.

Figure 4C:
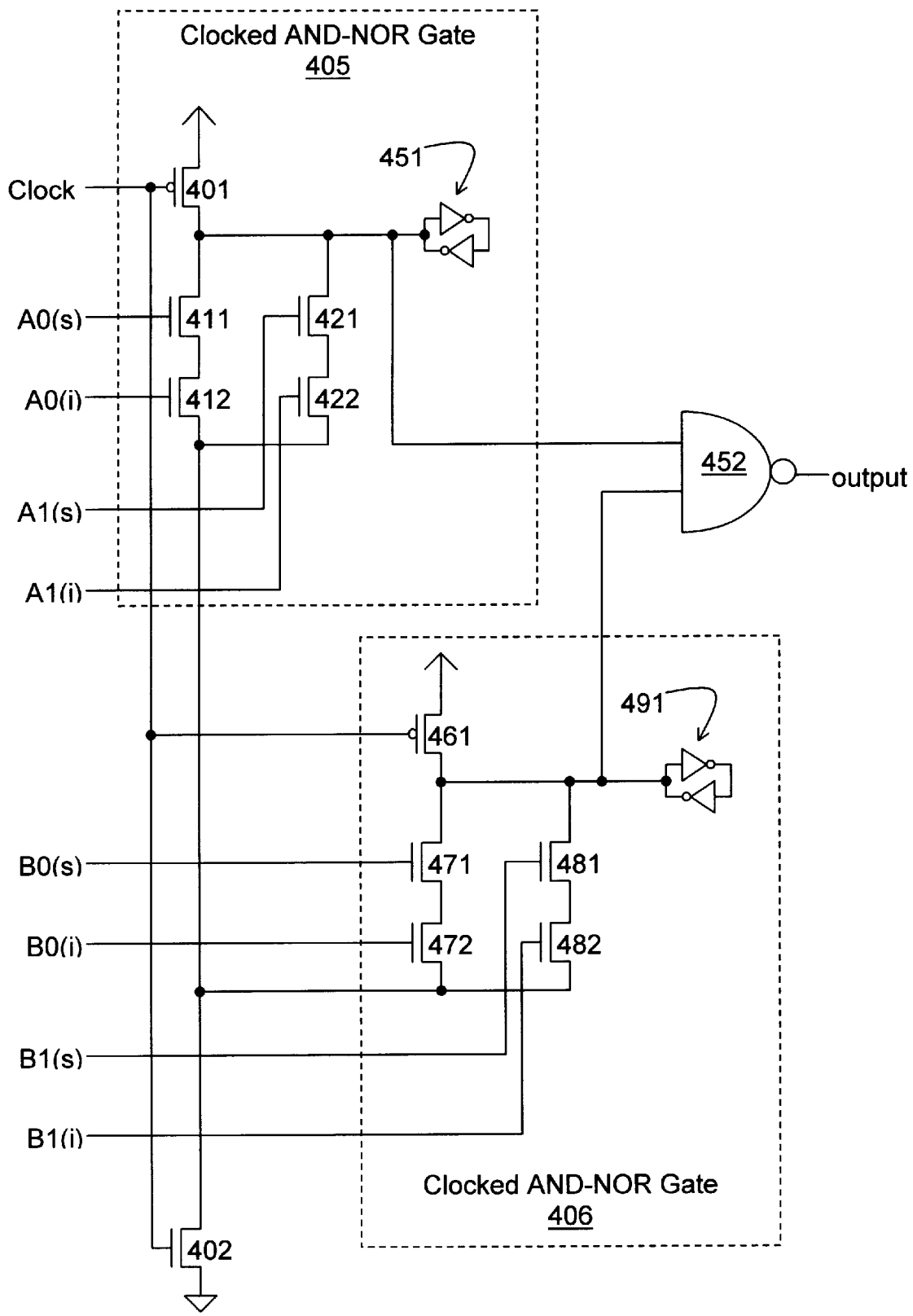
FIG. 4C is the multiplexer of FIG. 4B in circuit diagram form in accordance with an embodiment of the present invention.

FIG. 4C is the multiplexer of FIG. 4B in circuit diagram form in accordance with an embodiment of the present invention. This multiplexer circuit is similar in form and function to the multiplexer of FIG. 3A described above, but has been expanded to support additional input signals. The multiplexer includes input nodes coupled to input signal lines to receive input signals A0(i), A1(i), B0(i), and B1(i). The multiplexer also includes select signal input nodes coupled to select signal lines to receive select signals A0(s), A1(s), B0(s), and B1(s). Clocked AND-NOR gate 405 includes transistors 401, 411, 412, 421, 422, 402, and clamp 451 and receives the clock signal along with signals A0(i), A0(s), A1(i), and A1(s). Clocked AND-NOR gate 406 includes transistors 461, 471, 472, 481, 482, 402, and clamp 491 and receives the clock signal along with signals B0(i), B0(s), B1(i), and B1(s).

Pull-down transistors 411 and 412 of FIG. 4C are coupled together in series and are gated by A0(s) and A0(i), respectively. Pull-down transistors 421 and 422 are coupled together in series and are gated by A1(s) and A1(i), respectively. Pull-down transistors 471 and 472 are coupled together in series and are gated by B0(s) and B0(i), respectively. Pull-down transistors 481 and 482 are coupled together in series and are gated by B1(s) and B1(i), respectively.

The drains of transistors 411 and 421 of FIG. 4C are coupled to the drain of clocked pull-up transistor 401, and the sources of transistors 412 and 422 are coupled to the drain of clocked pull-down transistor 402. Similarly, the drains of transistors 471 and 481 are coupled to the drain of clocked pull-up transistor 461, and the sources of transistors 472 and 482 are coupled to the drain of clocked pull-down transistor 402. In this configuration, clocked pull-down transistor 402 is shared by both clocked AND-NOR gates 405 and 406. Voltage clamp 451 is coupled to the output node at the drain of transistor 401, and voltage clamp 491 is coupled to the output node at the drain of transistor 461. Both output nodes are coupled to the input nodes of NAND gate 452 which provides a multiplexed signal at its output node. This multiplexed signal represents the multiplexing of input signals A0(i), A1(i), B0(i), and B1(i) according to the values of mutually exclusive select signals A0(s), A1(s), B0(s), and B1(s), respectively. The sources of pull-up transistors 401 and 461 are coupled to a Vcc power supply line of the integrated circuit, and the source of shared pull-down transistor 402 is coupled to a ground line.

Because all the select signals to the multiplexer of FIG. 4C are mutually exclusive, the width of shared pull-down transistor 402 may be less than twice the width of the clocked pull-down transistor that would otherwise independently support either clocked AND-NOR gate 405 or 406. As such, a power savings is provided in comparison to the multiplexer that may otherwise have been formed by implementing separate, clocked, pull-down transistors for each AND-NOR gate. More specifically, in accordance with an embodiment of the present invention, transistor 402 is less than twice the size of the smaller of transistors 411, 412, 421, 422, 471, 472, 481, or 482. For this or another embodiment of the present invention, transistor 402 is less than twice the size of the smaller of clocked pull-up transistors 401 or 461.

In general, in accordance with one embodiment of the present invention, the size of the shared, clocked pull-down transistor is less than twice the size of any of the other pull-down transistors coupled in series between the shared pull-down transistor and the AND-NOR gate output node. These other pull-down transistors are the transistors having a gate coupled to either an input signal line or a select signal line of the multiplexer. For an alternate embodiment of the present invention, the size of the shared, clocked pull-down transistor is less than 1.5 times the size of any of the other pull-down transistors coupled in series between the shared pull-down transistor and the AND-NOR gate output node. Alternatively, for one embodiment of the present invention, the size of the shared, clocked pull-down transistor is less than twice the size of any of the clocked pull-up transistors of the AND-NOR gates. For another embodiment, the size of the shared, clocked pull-down transistor is less than 1.75 times the size of any of the clocked pull-up transistors of the AND-NOR gates.

In accordance with an alternate embodiment of the present invention, clocked AND-NOR gates 405 and 406 of FIG. 4C may accommodate additional input/select signal pairs and may be symmetric (i.e. both AND-NOR gates receive the same number of input and select signals) or asymmetric. An input/select signal pair is an input signal along with its associated select signal, such as signals A0(i) and A0(s).

For example, an eight-input multiplexer may be designed in accordance with an embodiment of the present invention by combining a first clocked AND-NOR gate that receives four input/select signal pairs with a second clocked AND-NOR gate that also receives four input/select signal pairs. Both AND-NOR gates may share the same, clocked, pull-down transistor. For another embodiment, an eight-input multiplexer may be designed by combining a first clocked AND-NOR gate that receives three input/select signal pairs with a second clocked AND-NOR gate that receives five input/select signal pairs. Again, both AND-NOR gates may share the same, clocked, pull-down transistor.

In accordance with an embodiment of the present invention, an AND-NOR gate may accommodate additional input/select signal pairs by modifying the AND-NOR circuit in a similar to the way in which the circuit of FIG. 4C is a modification over the circuit of FIG. 3A. In particular, additional input/select signal pairs may be accommodated by coupling the associated input and select signal lines to the gates of series-coupled (AND-configured) transistors coupled between the output node of the AND-NOR gate and the drain of clocked pull-down transistor. The output node of the AND-NOR gate serves to wire-NOR the AND-configured input/select signal pairs, thereby providing the AND-NOR function of the gate. Note that the clocked NAND gates in the embodiment of FIG. 3A described above may be considered a special case of an AND-NOR gate in which the ANDed signals are NORed with a logical "0." In other words, the output node of each NAND gate is coupled to only one AND-configured input/select signal pair, so there is only one signal to be NORed at the output node.

For one embodiment, a NAND gate having a fan-in of three or more may be implemented in place of NAND gate 452, or multiple NAND or other logic gates may be combined in a logic tree. For this embodiment, three or more clocked AND-NOR gates may be combined to create a multiplexer that can accommodate additional input signals. These additional clocked AND-NOR gates may similarly use shared, clocked, pull-down transistor 402 for size and power reduction.

This invention has been described with reference to specific exemplary embodiments thereof. It will, however, be evident to persons having the benefit of this disclosure that various modifications and changes may be made to these embodiments without departing from the broader spirit and scope of the invention. The specification and drawings are, accordingly, to be regarded in an illustrative rather than a restrictive sense.

What is claimed is:

1. A circuit comprising:
    a first pull-up transistor having a first gate coupled to a clock signal line and a first drain;
    a first voltage clamp coupled to the first drain;
    a second pull-up transistor having a second gate coupled to the clock signal line and a second drain;
    a second voltage clamp coupled to the second drain; and
    a shared pull-down transistor having a shared gate coupled to the clock signal line and a shared drain coupled to the first drain via at least one pull-down transistor in series with the shared pull-down transistor, the shared drain also being coupled to the second drain via at least one pull-down transistor in series with the shared pull-down transistor.

2. The circuit of claim 1, wherein the shared pull-down transistor has a width that is less than twice that of a smaller of either the first or second pull-up transistors.

3. The circuit of claim 1, further comprising:
    a first pull-down transistor having a source and drain coupled in series between the first drain and the shared drain, and a gate coupled to a first input signal line; and
    a second pull-down transistor having a source and drain coupled in series between the second drain and the shared drain, and a gate coupled to a second input signal line.

4. The circuit of claim 3, wherein the shared pull-down transistor has a width that is less than twice that of a smaller of either the first or second pull-down transistors.

5. The circuit of claim 3, further comprising:
    a third pull-down transistor having a source and drain coupled in series between the first drain and the shared drain, and a gate coupled to a first select signal line; and
    a fourth pull-down transistor having a source and drain coupled in series between the second drain and the shared drain, and a gate coupled to a second select signal line.

6. The circuit of claim 5, wherein the shared pull-down transistor has a width that is less than twice that of a smaller of either the third or fourth pull-down transistors.

7. The circuit of claim 6, further comprising:
    a first output node coupled to the first drain, the first output node to provide a signal that is a result of a logical AND-NOR function including an AND function applied to a clock signal on the clock signal line, a first input signal on the first input signal line, and a first select signal on the first select signal line; and
    a second output node coupled to the second drain, the second output node to provide a signal that is a result of a logical AND-NOR function including an AND function applied to the clock signal on the clock signal line, a second input signal on the second input signal line, and a second select signal on the second select signal line.

8. The circuit of claim 7, further comprising a NAND gate having a first input node coupled to the first output node, a second input node coupled to the second output node, and an output node to provide a multiplexed signal.

9. A multiplexer comprising:
    a first clocked AND-NOR gate having a first input node coupled to a clock signal line and a first output node coupled to a first voltage clamp;
    a second clocked AND-NOR gate having a second input node coupled to the clock signal line and a second output node coupled to a second voltage clamp; and
    a shared pull-down transistor having a gate coupled to the clock signal line and a drain coupled to the first output node via at least one pull-down transistor in series with the shared pull-down transistor, the drain also being coupled to the second output node via at least one pull-down transistor in series with the shared pull-down transistor.

10. The multiplexer of claim 9, wherein the first clocked AND-NOR gate is coupled to a first plurality of input and select signal lines, and the second AND-NOR gate is coupled to a second plurality of input and select signal lines.

11. The multiplexer of claim 10, wherein the shared pull-down transistor has a width that is less than twice that of a smaller of either a transistor having a gate coupled to one of the first plurality of input and select signal lines or a transistor having a gate coupled to one of the second plurality of input and select signal lines.

12. The multiplexer of claim 11, wherein the first and second plurality of select signal lines are to transmit mutually exclusive select signals.

13. The multiplexer of claim 9, further comprising a NAND gate having input nodes coupled to the first and second output nodes, the NAND gate having an output node to transmit a multiplexed signal based on input signals transmitted along the first and second plurality of input and select signal lines.

14. The multiplexer of claim 9, wherein the shared pull-down transistor includes a source coupled to a ground line.

15. A multiplexer comprising:
    a first clocked AND-NOR gate to receive a first plurality of input/select signal pairs, the first AND-NOR gate including a clocked pull-up transistor having a first width, and a shared, clocked, pull-down transistor having a source coupled to a ground line; and a second clocked AND-NOR gate to receive a second plurality of input/select signal pairs, the second AND-NOR gate including a clocked, pull-up transistor having a second width, and the pull-down transistor, the pull-down transistor having a third width that is less than twice a lesser of the first and second widths.

16. The multiplexer of claim 15, wherein the third width is less than 1.75 times a lesser of the first and second widths.

17. The multiplexer of claim 15, further comprising:

a first voltage clamp coupled to an output node of the first clocked AND-NOR gate; and a second voltage clamp coupled to an output node of the second clocked AND-NOR gate.

18. The multiplexer of claim 15, further comprising a NAND gate having input nodes coupled to output nodes of the first and second clocked AND-NOR gates.

* * * * *

UNITED STATES PATENT AND TRADEMARK OFFICE
CERTIFICATE OF CORRECTION

PATENT NO. : 6,111,435
DATED : August 29, 2000
INVENTOR(S) : Lan et al.

It is certified that error appears in the above-identified patent and that said Letters Patent is hereby corrected as shown below:

<u>Column 2,</u>
Line 2, before " the multiplexer", insert -- is --.

Signed and Sealed this

Twenty-eighth Day of May, 2002

Attest:

Attesting Officer

JAMES E. ROGAN
*Director of the United States Patent and Trademark Office*